US011271257B2

(12) United States Patent
Li et al.

(10) Patent No.: US 11,271,257 B2
(45) Date of Patent: Mar. 8, 2022

(54) METHOD FOR CHARGING SECONDARY BATTERY

(71) Applicant: TOYOTA JIDOSHA KABUSHIKI KAISHA, Toyota (JP)

(72) Inventors: Ximeng Li, Susono (JP); Masafumi Nose, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 244 days.

(21) Appl. No.: 16/443,946

(22) Filed: Jun. 18, 2019

(65) Prior Publication Data

US 2020/0020989 A1 Jan. 16, 2020

(30) Foreign Application Priority Data

Jul. 12, 2018 (JP) ............................ JP2018-132606

(51) Int. Cl.

*H01M 10/44* (2006.01)
*G01R 31/382* (2019.01)
*H01M 10/0562* (2010.01)
*H02J 7/00* (2006.01)

(52) U.S. Cl.

CPC .......... *H01M 10/44* (2013.01); *G01R 31/382* (2019.01); *H01M 10/0562* (2013.01); *H02J 7/0091* (2013.01)

(58) Field of Classification Search

CPC ........... H01M 10/052; H01M 10/0562; H01M 10/4235; H01M 10/44; H01M 10/443; H01M 10/446; H01M 4/13; H01M 4/382; H01M 4/525; H01M 2300/0068; G01R 31/382; G01R 31/387; H02J 7/0091; H02J 7/00; Y02E 60/10

See application file for complete search history.

(56) References Cited

U.S. PATENT DOCUMENTS 6,623,888 B1 * 9/2003 Omaru ............. H01M 10/0525 429/231.8
6,787,269 B2 * 9/2004 Sekino ............. H01M 10/0569 429/338
7,824,801 B2 * 11/2010 Kogetsu ................ H01M 4/366 429/218.1

(Continued)

FOREIGN PATENT DOCUMENTS

DE 10 2015 112 182 A1 2/2016
JP 2002246070 A 8/2002

(Continued)

*Primary Examiner* — Helen Rossoshek
(74) *Attorney, Agent, or Firm* — Oliff PLC

(57) ABSTRACT

Provided is a method for charging a secondary battery configured to both suppress battery short circuits and to reduce battery charging time. The charging method is a multistep secondary battery charging method comprising first charging in which a secondary battery is charged at a first current density I1, and second charging in which the secondary battery is charged at a second current density I2 which is larger than the first current density I1, wherein, when a roughness height of an anode current collecting foil-side surface of a solid electrolyte layer is determined as Y (μm) and a thickness of a roughness coating layer is determined as X (μm), in the first charging, the secondary battery is charged at the first current density I1 until X/Y reaches 0.5 or more.

6 Claims, 3 Drawing Sheets

11
L1
L2
L3
X
Y
15
18

(56) References Cited

U.S. PATENT DOCUMENTS

| | | | | |
|---|---|---|---|---|
| 7,887,955 | B2 * | 2/2011 | Saruwatari | H01M 50/54 429/246 |
| 8,951,672 | B2 * | 2/2015 | Hirose | H01M 10/0525 429/220 |
| 9,583,791 | B2 * | 2/2017 | Kawashima | H01M 10/0569 |
| 9,647,263 | B2 * | 5/2017 | Green | C01B 33/02 |
| 9,871,248 | B2 * | 1/2018 | Rayner | H01M 4/134 |
| 2003/0003364 | A1 | 1/2003 | Mori et al. | |
| 2008/0166637 | A1 * | 7/2008 | Inagaki | H01M 10/0567 429/329 |
| 2010/0099018 | A1 * | 4/2010 | Kawase | H01M 4/505 429/105 |
| 2010/0159337 | A1 * | 6/2010 | Matsumoto | H01M 4/366 429/337 |
| 2011/0027650 | A1 * | 2/2011 | Yamamoto | H01M 4/62 429/218.1 |
| 2013/0321111 | A1 * | 12/2013 | O'Brien | C25C 7/04 335/284 |
| 2016/0036091 | A1 | 2/2016 | Ohtomo et al. | |
| 2016/0049661 | A1 * | 2/2016 | Ota | H01M 4/661 429/241 |
| 2016/0329618 | A1 * | 11/2016 | Zhang | H01M 8/0444 |
| 2017/0271714 | A1 * | 9/2017 | Iwasaki | H01M 4/131 |
| 2017/0301911 | A1 * | 10/2017 | Hirose | H01M 10/0569 |
| 2018/0205089 | A1 * | 7/2018 | Unnikrishnan | H01M 6/40 |
| 2019/0207264 | A1 * | 7/2019 | Busacca | H01M 10/0404 |
| 2021/0066755 | A1 * | 3/2021 | Wang | H01M 4/505 |

FOREIGN PATENT DOCUMENTS

| | | | |
|---|---|---|---|
| JP | 2002373707 | A | 12/2002 |
| JP | 2005185060 | A | 7/2005 |

* cited by examiner

METHOD FOR CHARGING SECONDARY BATTERY

TECHNICAL FIELD

The disclosure relates to a method for charging a secondary battery.

BACKGROUND

In recent years, with the rapid spread of IT and communication devices such as personal computers, camcorders and cellular phones, great importance has been attached to the development of batteries that can be used as the power source of such devices. In the automobile industry, etc., high-power and high-capacity batteries for electric vehicles and hybrid vehicles are under development.

Of various types of batteries, a lithium secondary battery has attracted attention because, due to the use of lithium as the anode of the battery, which is a metal having the highest ionization tendency among metals, a large potential difference between the anode and the cathode and high output voltage are obtained.

Patent Literature 1 discloses a lithium ion secondary battery in which overcharging and the like can be suppressed and the battery charging time can be reduced by decreasing charging current supplied from a battery charger and by charging the battery.

Patent Literature 2 discloses a nonaqueous electrolyte secondary battery in which overcharging and the like can be suppressed and the battery charging time can be reduced by quick charging at a high current value and then charging at a low current value.

Patent Literature 3 discloses a technique to stabilize the anode surface of a lithium secondary battery and suppress the growth of lithium dendrite by disposing a lithium ion supporting layer at an interface between the lithium metal anode and electrolyte of the lithium secondary battery.

Patent Literature 1: Japanese Patent Application Laid-Open (JP-A) No. 2005-185060

Patent Literature 2: JP-A No. 2002-246070

Patent Literature 3: JP-A No. 2002-373707

In batteries such as a lithium secondary battery, a short circuit is likely to occur when a current value supplied from a battery charger during battery charging, is large. On the other hand, when the current value supplied from the battery charger is small, the battery charging time is increased.

Accordingly, there is a demand for both suppression of battery short circuits, and a reduction in battery charging time.

SUMMARY

In light of the above circumstance, an object of the disclosed embodiments is to provide a method for charging a secondary battery configured to both suppress battery short circuits and to reduce battery charging time.

In a first embodiment, there is provided a method for charging a secondary battery comprising a cathode current collecting foil, a cathode active material layer, a solid electrolyte layer and an anode current collecting foil in this order and using a lithium metal precipitation-dissolution reaction as an anode reaction, wherein the charging method is a multistep secondary battery charging method comprising at least:

first charging in which, by charging the secondary battery at a first current density I1 (mA/cm$^2$), a lithium metal is precipitated on an anode current collecting foil-side surface of the solid electrolyte layer to form a roughness coating layer which is a part of an anode active material layer and which is composed of the lithium metal, and second charging in which, after the first charging, the secondary battery is charged at a second current density I2 which is larger than the first current density I1 to increase a thickness of the roughness coating layer, and wherein, when a roughness height of the anode current collecting foil-side surface of the solid electrolyte layer is determined as Y (μm) and a thickness of the roughness coating layer is determined as X (μm), in the first charging, the secondary battery is charged at the first current density I1 until X/Y reaches 0.5 or more.

The charging method of the disclosed embodiments may comprise calculating a state-of-charge (SOC) value of the secondary battery based on a temperature T, current density I and voltage V of the secondary battery after measuring the temperature T, the current density I and the voltage V;

wherein, if the SOC is a predetermined threshold value (SOC (pre-Li)) or less, the first charging is carried out;

wherein, if the SOC is more than the threshold value, the second charging is carried out; and wherein the threshold value satisfies the following formula (1):

$$\mathrm{Soc(pre\text{-}Li)}(\%)=[\{S\times(Y/10000)\times D\times Z/2\}/M]\times 100 \qquad \text{Formula (1)}$$

where S is an area (cm$^2$) of the anode; Y is the roughness height (μm) of the solid electrolyte layer; D is a density (g/cm$^3$) of the lithium metal; Z is a theoretical capacity (mAh/g) of the lithium metal; and M is a capacity (mAh) of the secondary battery.

In the charging method of the disclosed embodiments, the first current density I1 may be determined from the temperature T and the SOC, based on a first data group showing a relationship between the current density I and the previously calculated temperature T and SOC.

In the charging method of the disclosed embodiments, the second current density I2 may be determined from the temperature T and the threshold value, based on a second data group showing a relationship between the current density I and the previously calculated temperature T and threshold value.

The charging method of the disclosed embodiments may be such that in the first charging, measurement of the temperature T and calculation of the SOC are carried out every time a predetermined time elapses; if the SOC is the threshold value or less, based on the first data group, the current density I corresponding to the temperature T and the SOC is used as the first current density I1, and the secondary battery is charged at the first current density I1; and if the SOC is more than the threshold value, the first charging is stopped, and the second charging is carried out.

The charging method of the disclosed embodiments may be such that in the second charging, measurement of the temperature T and calculation of the SOC are carried out every time a predetermined time elapses; if the SOC is less than 100%, based on the second data group, the current density I corresponding to the temperature T and the SOC is used as the second current density I2, and the secondary battery is charged at the second current density I2; and if the SOC is 100% or more, the second charging is stopped.

In another embodiment, there is provided a method for charging a secondary battery comprising a cathode current collecting foil, a cathode active material layer, a solid electrolyte layer and an anode current collecting foil in this order and using a lithium metal precipitation-dissolution reaction as an anode reaction, wherein the method comprises calculating a state-of-charge (SOC) value of the secondary battery based on a temperature T, current density I and voltage V of the secondary battery after measuring the temperature T, the current density I and the voltage V;

wherein, if the SOC is a predetermined threshold value (SOC (pre-Li)) or less, first charging in which, by charging the secondary battery at a first current density I1 (mA/cm$^2$), a lithium metal is precipitated on an anode current collecting foil-side surface of the solid electrolyte layer to form a roughness coating layer which is a part of an anode active material layer and which is composed of the lithium metal, is carried out;

wherein, if the SOC is more than the threshold value, second charging in which the secondary battery is charged at a second current density I2 which is larger than the first current density I1 to increase a thickness of the roughness coating layer, is carried out; and wherein the threshold value satisfies the following formula (1):

$$\mathrm{Soc(pre\text{-}Li)}(\%)=[\{S\times(Y/10000)\times D\times Z/2\}/M]\times 100 \qquad \text{Formula (1)}$$

where S is an area (cm$^2$) of the anode; Y is a roughness height (μm) of the anode current collecting foil-side surface of the solid electrolyte layer; D is a density (g/cm$^3$) of the lithium metal; Z is a theoretical capacity (mAh/g) of the lithium metal; and M is a capacity (mAh) of the secondary battery.

According to the disclosed embodiments, a method for charging a secondary battery configured to both suppress battery short circuits and to reduce battery charging time, can be provided.

BRIEF DESCRIPTION OF THE DRAWINGS

In the accompanying drawings.

DETAILED DESCRIPTION

The charging method of the disclosed embodiments is a method for charging a secondary battery comprising a cathode current collecting foil, a cathode active material layer, a solid electrolyte layer and an anode current collecting foil in this order and using a lithium metal precipitation-dissolution reaction as an anode reaction, wherein the charging method is a multistep secondary battery charging method comprising at least:

first charging in which, by charging the secondary battery at a first current density I1 (mA/cm$^2$), a lithium metal is precipitated on an anode current collecting foil-side surface of the solid electrolyte layer to form a roughness coating layer which is a part of an anode active material layer and which is composed of the lithium metal, and second charging in which, after the first charging, the secondary battery is charged at a second current density I2 which is larger than the first current density I1 to increase a thickness of the roughness coating layer, and wherein, when a roughness height of the anode current collecting foil-side surface of the solid electrolyte layer is determined as Y (μm) and a thickness of the roughness coating layer is determined as X (μm), in the first charging, the secondary battery is charged at the first current density I1 until X/Y reaches 0.5 or more.

In the disclosed embodiments, "lithium secondary battery" means a battery in which at least one of a lithium metal and a lithium alloy is used as the anode active material and a lithium metal precipitation-dissolution reaction is used as an anode reaction.

Also in the disclosed embodiments, "lithium ion secondary battery" means a battery in which at least one of a lithium metal and a lithium alloy is not used as the anode active material and which is charged and discharged by lithium ion transfer between the cathode and the anode.

A secondary battery (e.g., a lithium secondary battery) in which a solid electrolyte is used as the electrolyte, is charged at a low current density, thereby precipitating a roughness coating layer, which is composed of a lithium metal, on an anode current collecting foil-side surface of a solid electrolyte layer and coating the roughness of the anode current collecting foil-side surface of the solid electrolyte layer with the roughness coating layer. After coating the roughness with the roughness coating layer, the battery is charged at a high current density. It was found that both suppression of battery short circuits and a reduction in battery charging time, can be achieved, accordingly.

Figure 1:
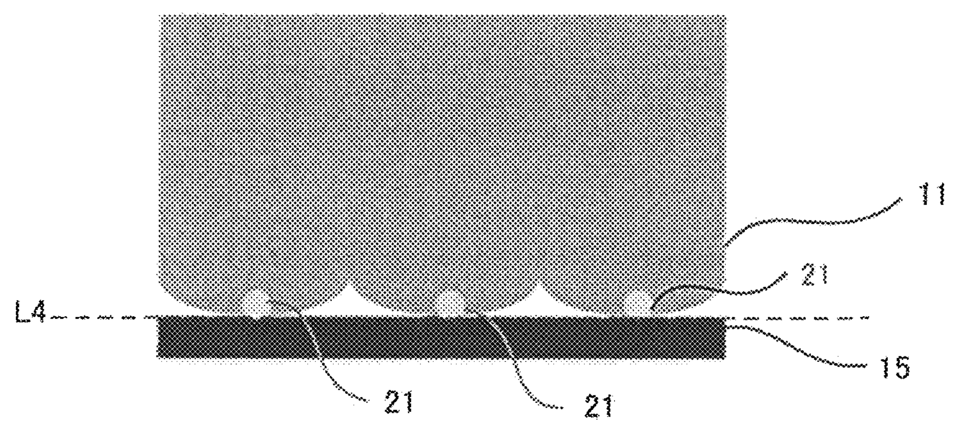
FIG. 1 is a view showing an example of a state in which the solid electrolyte layer and anode current collecting foil of an all-solid-state lithium secondary battery before being initially charged, are stacked.

FIG. 1 is a view showing an example of a state in which the solid electrolyte layer and anode current collecting foil of an all-solid-state lithium secondary battery before being initially charged, are stacked.

The anode current collecting foil-side surface of a solid electrolyte layer 11 shown in FIG. 1, is not flat. As shown in FIG. 1, the solid electrolyte layer 11 is in contact with an anode current collecting foil 15 at contact points 21. Each contact point 21 serves as a starting point of lithium metal precipitation that occurs during battery charging (hereinafter, the starting point may be referred to as lithium metal precipitation starting point). In FIG. 1, the surface of the anode current collecting foil 15 is an example and shown as a flat surface. However, the surface of the anode current collecting foil 15 used in the disclosed embodiments, may be a non-flat surface.

A dashed line L4 shown in FIG. 1 is a border line between the solid electrolyte layer 11 and the anode current collecting foil 15.

Figure 2:
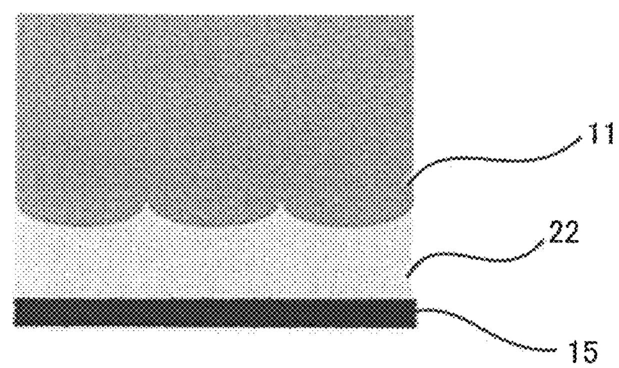
FIG. 2 is a view showing an example of a case where an all-solid-state lithium secondary battery is charged at a low current density to precipitate a lithium metal at an interface between the solid electrolyte layer and anode current collecting foil of the battery.

FIG. 2 is a view showing an example of a case where an all-solid-state lithium secondary battery is charged at a low current density to precipitate a lithium metal at an interface between the solid electrolyte layer and anode current collecting foil of the battery.

As shown in FIG. 2, a lithium metal 22 can be uniformly precipitated when the battery is charged at a low current density from the start to end of the charging. Also, when the battery is charged at a low current density, the battery undergoes a small change in battery temperature. However, when the battery is charged at a low current density, the battery requires a long charging time to reach a SOC of 100%.

Figure 3:
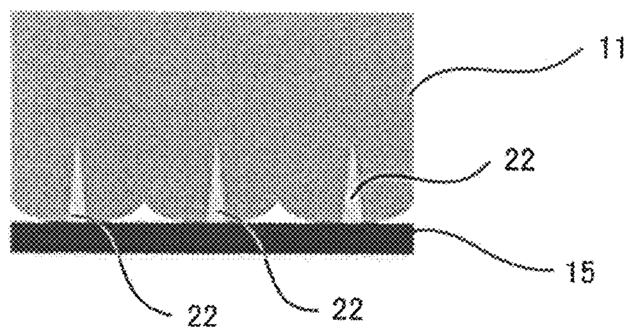
FIG. 3 is a view showing an example of a case where an all-solid-state lithium secondary battery is charged at a high current density to precipitate a lithium metal at an interface between the solid electrolyte layer and anode current collecting foil of the battery.

FIG. 3 is a view showing an example of a case where an all-solid-state lithium secondary battery is charged at a high current density to precipitate a lithium metal at an interface between the solid electrolyte layer and anode current collecting foil of the battery.

As shown in FIG. 3, when the battery is charged at a high current density from the start to the end of the charging, the lithium metal 22 is locally precipitated at the contact points between the solid electrolyte layer 11 and the anode current collecting foil 15. If the locally-precipitated lithium metal 22 reaches the cathode (not shown), a battery short circuit may occur. By charging the battery at a high current density, a rapid increase in battery temperature may be caused, or the battery may be insufficiently charged and cause a decrease in battery performance.

Figure 4:
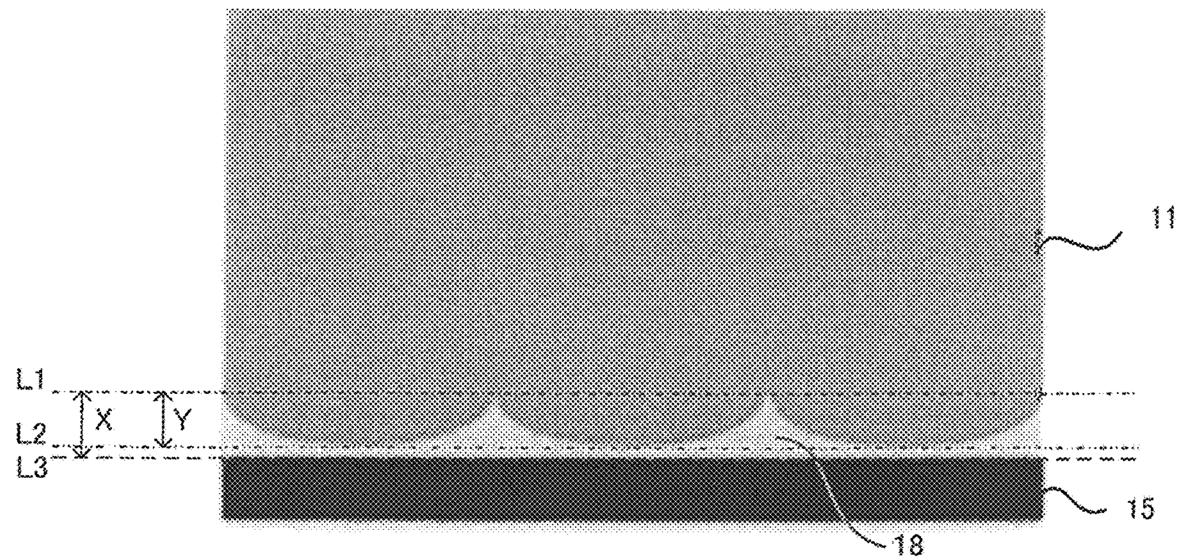
FIG. 4 is a schematic sectional view of an example of a stack of the solid electrolyte layer, roughness coating layer and anode current collecting foil of an all-solid-state lithium secondary battery after the first charging of the charging method according to the disclosed embodiments, the layers and foil being stacked in this order.

FIG. 4 is a schematic sectional view of an example of a stack of the solid electrolyte layer, roughness coating layer and anode current collecting foil of an all-solid-state lithium secondary battery, the layers and foil being stacked in this order, for the purpose of illustration of the roughness coating layer formed at the interface between the solid electrolyte layer and the anode current collecting foil in the first charging of the charging method of the disclosed embodiments.

In the charging method of the disclosed embodiments, by charging the secondary battery used in the charging method, a roughness coating layer 18, which is composed of precipitated lithium, is formed between the solid electrolyte layer 11 and the anode current collecting foil 15, as shown in FIG. 4.

A long dashed short dashed line L1 shown in FIG. 4 is the reference line of the roughness height Y of the anode current collecting foil-side surface of the solid electrolyte layer 11.

A long dashed double-short dashed line L2 shown in FIG. 4 is a line indicating the maximum height of the roughness of the anode current collecting foil-side surface of the solid electrolyte layer 11. It is also a line corresponding to the dashed line L4 shown in FIG. 1.

A dashed line L3 shown in FIG. 4 is a border line between the anode current collecting foil 15 and the roughness coating layer 18.

In FIG. 4, a distance from the long dashed short dashed line L1 to the long dashed double-short dashed line L2 is the roughness height Y of the anode current collecting foil-side surface of the solid electrolyte layer 11. Also in FIG. 4, the sum of the distance from the long dashed double-short dashed line L2 to the long dashed short dashed line L1 and a distance from the long dashed double-short dashed line L2 to the dashed line L3, is the thickness X of the roughness coating layer 18.

In FIG. 1, when the contact points 21 are deemed as a border between the solid electrolyte layer 11 and anode current collecting foil 15, and when the border line L4 is drawn in FIG. 1 as a dashed line, the border line L4 may be used as the reference line of the thickness X of the roughness coating layer 18.

The thickness X of the roughness coating layer 18 may be the sum of the thickness of the lithium metal precipitated to coat the roughness of the anode current collecting foil-side surface of the solid electrolyte layer 11 (the thickness corresponding to the distance between L1 and L2 in FIG. 4) and the thickness of the lithium metal precipitated in the direction of the anode current collecting foil 15 (the thickness corresponding to the distance between L2 and L3 in FIG. 4), using the border line L4 as the reference line.

For calculation of the thickness X of the roughness coating layer 18, it is deemed that the coating of the roughness of the anode current collecting foil-side surface of the solid electrolyte layer 11 with the lithium metal, is more preferentially caused than the precipitation of the lithium metal in the direction of the anode current collecting foil 15, until the roughness of the anode current collecting foil-side surface of the solid electrolyte layer 11 is absolutely coated with the roughness coating layer 18 composed of the lithium metal (that is, X/Y=1). The thickness of the lithium metal precipitated in the direction of the anode current collecting foil 15 may be disregarded.

In the first charging of the disclosed embodiments, by charging the battery at a low current density, the lithium metal can be uniformly precipitated on the anode current collecting foil-side surface of the solid electrolyte layer, and the lithium metal precipitation starting points can be highly dispersed.

More specifically, it is presumed as follows: in the first charging of the disclosed embodiments, the roughness coating layer composed of the lithium metal is started to be formed at the contact points between the surface of the anode current collecting foil and the surface of the solid electrolyte layer, the contact points serving as the precipitation starting points. By charging the battery, the roughness of the anode current collecting foil-side surface of the solid electrolyte layer is gradually coated with the lithium metal, from the anode current collecting foil side to the solid electrolyte layer. Then, by coating the roughness of the anode current collecting foil-side surface of the solid electrolyte layer with the lithium metal, the roughness coating layer composed of the lithium metal can be uniformly formed at an interface between the solid electrolyte layer and the anode current collecting foil. As a result, during further precipitation of the lithium metal, the precipitation starting points can be highly dispersed. Then, the anode active material layer, which is the roughness coating layer, is uniformly formed by subsequent charging of the battery.

According to the charging method of the disclosed embodiments, therefore, by initially charging the battery at a low current density, the lithium metal can be uniformly precipitated on the anode current collecting foil-side surface of the solid electrolyte layer; the lithium metal precipitation starting points can be highly dispersed; and interface contact between the solid electrolyte layer and the anode current collecting foil can be excellent. After the interface contact between the solid electrolyte layer and the anode current collecting foil becomes excellent, the battery is charged at a high current density. Accordingly, the uniformly-precipitated lithium metal can be uniformly grown. As a result, even when the battery is charged at a high current density, the interface contact can be kept in an excellent state, and battery short circuits can be suppressed. Therefore, according to the charging method of the disclosed embodiments, both quick battery charging and suppression of battery short circuits, can be achieved.

The charging method of the disclosed embodiments comprises at least (1) first charging and (2) second charging. As needed, it further comprises (3) calculating SOC.

Hereinafter, they will be described in order.

(1) First Charging

The first charging is a step in which, by charging the secondary battery at a first current density I1 ($mA/cm^2$), a lithium metal is precipitated on an anode current collecting foil-side surface of the solid electrolyte layer to form a roughness coating layer which is a part of an anode active material layer and which is composed of the lithium metal.

When a roughness height of the anode current collecting foil-side surface of the solid electrolyte layer is determined as Y (μm) and a thickness of the roughness coating layer is determined as X (μm), in the first charging, the secondary battery may be charged at the first current density I1 until X/Y reaches 0.5 or more.

By charging the secondary battery at the first current density I1 until the X/Y reaches 0.5 or more, the roughness coating layer having a desired thickness can be formed on the roughness of the anode current collecting foil-side surface of the solid electrolyte layer, and both suppression of battery short circuits and a reduction in battery charging time, can be achieved. If the X/Y is 0.5, it means that a space between the solid electrolyte layer and the anode current collecting foil, which is created by the roughness of the anode current collecting foil-side surface of the solid electrolyte layer, is occupied by the roughness coating layer to half the roughness height Y.

The upper limit of the X/Y is not particularly limited. From the viewpoint of reducing the battery charging time, the upper limit may be 5.0 or less, may be 2.5 or less, or may be 1.0 or less.

The method for measuring the roughness height Y of the anode current collecting foil-side surface of the solid electrolyte layer, is not particularly limited. The roughness height Y can be measured from a scanning electron microscope (SEM) image of a section of the solid electrolyte layer.

In the disclosed embodiments, the roughness height Y is the maximum height (μm) of the surface roughness defined by the surface roughness parameter JIS B 0601-2001. The upper limit of the roughness height Y is not particularly limited and varies depending on the solid electrolyte used, the method for forming the solid electrolyte layer, etc. For example, the upper limit may be 5.0 μm or less. The lower limit of the roughness height Y is not particularly limited. For example, the lower limit may be 0.1 μm or more, may be 0.5 μm or more, may be 1.0 μm or more, or may be 2.0 μm or more.

The thickness X of the roughness coating layer can be calculated from the below-described SOC of the battery. The upper limit of the thickness X of the roughness coating layer is not particularly limited and varies depending on the cathode or anode active material used. The lower limit of the thickness X of the roughness coating layer varies depending on the value of the roughness height Y. The lower limit may be a thickness at which the X/Y is 0.5 or more.

More specifically, the thickness X of the roughness coating layer can be calculated as follows: the capacity of the Li metal of the roughness coating layer (Li capacity β (mAh) in the roughness coating layer) is calculated from the SOC of the battery, and then the thickness X of the roughness coating layer is calculated from the Li capacity β in the roughness coating layer, using the below-described formula (2). The Li capacity β in the roughness coating layer can be obtained by calculating the capacity of the secondary battery at the latest SOC from the capacity of the secondary battery at a SOC of 100%.

In the charging method of the disclosed embodiments, the first current density I1 may be determined from the temperature T of the battery and the SOC of the battery, based on a first data group showing a relationship between the current density I of the battery and the previously calculated temperature T and SOC of the battery.

The method for creating the first data group is not particularly limited. For example, first, testing batteries are prepared; at the same temperature, the batteries are charged at different current densities I; and an upper limit current density IX1 at which, at that temperature, a uniform roughness coating layer can be formed and a desired battery reversible capacity can be ensured, is determined. An upper limit current density IX1 at another temperature may be determined by calculation by exponential function plots using the Arrhenius equation, etc.

(2) Second Charging

The second charging is a step in which, after the first charging, the secondary battery is charged at a second current density I2 which is larger than the first current density I1 to increase the thickness of the roughness coating layer.

The second current density I2 is not particularly limited, as long as it is larger than the first current density I1, from the viewpoint of reducing the battery charging time.

Also, the second current density I2 may be determined from the temperature T and threshold value of the battery, based on a second data group showing a relationship between the current density I of the battery and the previously calculated temperature T and threshold value of the battery, which will be described below.

The method for creating the second data group is not particularly limited. For example, first, testing batteries are prepared; at the same temperature, the batteries are charged at different current densities I; and an upper limit current density IX2 at which, at that temperature, the batteries causes no short circuit, is determined. An upper limit current density IX2 at another temperature may be determined by calculation by exponential function plots using the Arrhenius equation, etc.

(3) Calculating SOC

This is a step of calculating the state-of-charge (SOC) value of the secondary battery based on the temperature T, current density I and voltage V of the secondary battery after measuring the temperature T, the current density I and the voltage V.

In the disclosed embodiments, the SOC (state of charge) value means the percentage of the charge capacity with respect to the full charge capacity of the battery. The full charge capacity is a SOC of 100%.

For example, the SOC may be estimated from the open circuit voltage (OCV) of the battery. More specifically, first, the temperature T and current density I of the secondary battery are measured in advance. A third data group storing the measured temperature T and current density I of the secondary battery and a characteristic relationship between the open circuit voltage (OCV) and SOC of the secondary battery, is prepared. Then, the battery voltage of the secondary battery, which is a voltage between the terminals of the secondary battery, is measured and determined as the open circuit voltage (OCV). Next, the SOC of the secondary battery is estimated by matching the temperature T, current density I and open circuit voltage (OCV) of the secondary battery to the third data group.

The methods for measuring the temperature T, current density I and voltage V of the secondary battery are not particularly limited. They can be measured by conventionally-known methods.

The timing for calculating the SOC is not particularly limited. The SOC may be calculated before the first charging; it may be calculated during the first charging; it may be calculated after the first charging and before the second charging; or it may be calculated during the second charging.

[Determining Threshold Value]

In the charging method of the disclosed embodiments, the predetermined threshold value (SOC (pre-Li)) may be determined.

The threshold value (SOC (pre-Li)) is a value corresponding to the amount of the lithium metal occupying the space created at the interface between the solid electrolyte layer and the anode current collecting foil by the roughness of the anode current collecting foil-side surface of the solid electrolyte layer. The threshold value varies depending on the materials forming the battery or the method for forming the battery. Accordingly, the threshold value may be appropriately determined depending on the materials forming the battery or the method for forming the battery. Also, the threshold value may be appropriately determined depending on the depth of discharge of the battery.

In the disclosed embodiments, the threshold value (SOC (pre-Li)) may satisfy the following formula (1):

$$\mathrm{Soc(pre\text{-}Li)}(\%)=[\{S\times(Y/10000)\times D\times Z/2\}/M]\times 100 \qquad \text{Formula (1):}$$

Also, S, Y, D, Z and M in the formula (1) are as described below.

S: Area ($cm^2$) of the anode

Y: Roughness height (μm) of the anode current collecting foil-side surface of the solid electrolyte layer D: Density ($g/cm^3$) of the lithium metal Z: Theoretical capacity (mAh/g) of the lithium metal M: Capacity (mAh) of the secondary battery The area S ($cm^2$) of the anode is the same as the area of the cathode. Accordingly, the area of the anode can be calculated from the area of the cathode.

The roughness height Y (μm) of the anode current collecting foil-side surface of the solid electrolyte layer can be measured in a sectional SEM image.

The density D of the lithium metal is 0.534 $g/cm^3$.

The theoretical capacity Z of the lithium metal is 3861.1 mAh/g.

The capacity M (mAh) of the secondary battery is appropriately calculated since it varies depending on the materials for the battery and the amounts of the materials used.

The reason for the division by 2 on the right side of the formula (1), is to express such a state that the roughness coating layer which has a thickness half the Y (X/Y=0.5) is formed.

[Charging Method]

The charging method of the disclosed embodiments may be as follows. The predetermined threshold value (SOC (pre-Li)) is determined, and if the SOC of the battery calculated in the calculating the SOC is the predetermined threshold value or less, the first charging is carried out. If the SOC of the battery calculated in the calculating the SOC is more than the threshold value, the second charging is carried out.

Also, the charging method of the disclosed embodiments may be as follows. In the first charging, measurement of the temperature T of the battery and calculation of the SOC of the battery are carried out every time a predetermined time elapses; if the SOC is the threshold value or less, based on the first data group, the current density I of the battery corresponding to the temperature T and the SOC is used as the first current density I1, and the battery is charged at the first current density I1; and if the SOC is more than the threshold value, the first charging is stopped, and the second charging is carried out.

Also, the charging method of the disclosed embodiments may be as follows. In the second charging, measurement of the temperature T of the battery and calculation of the SOC of the battery are carried out every time a predetermined time elapses; if the SOC is less than 100%, based on the second data group, the current density I of the battery corresponding to the temperature T and the SOC is used as the second current density I2, and the battery is charged at the second current density I2; and if the SOC is 100% or more, the second charging may be stopped.

The measurement of the temperature T of the battery and the calculation of the SOC of the battery are carried out every time the predetermined time elapses. The time interval is not particularly limited and can be appropriately determined depending on the capacity of the battery, etc.

Figure 5:
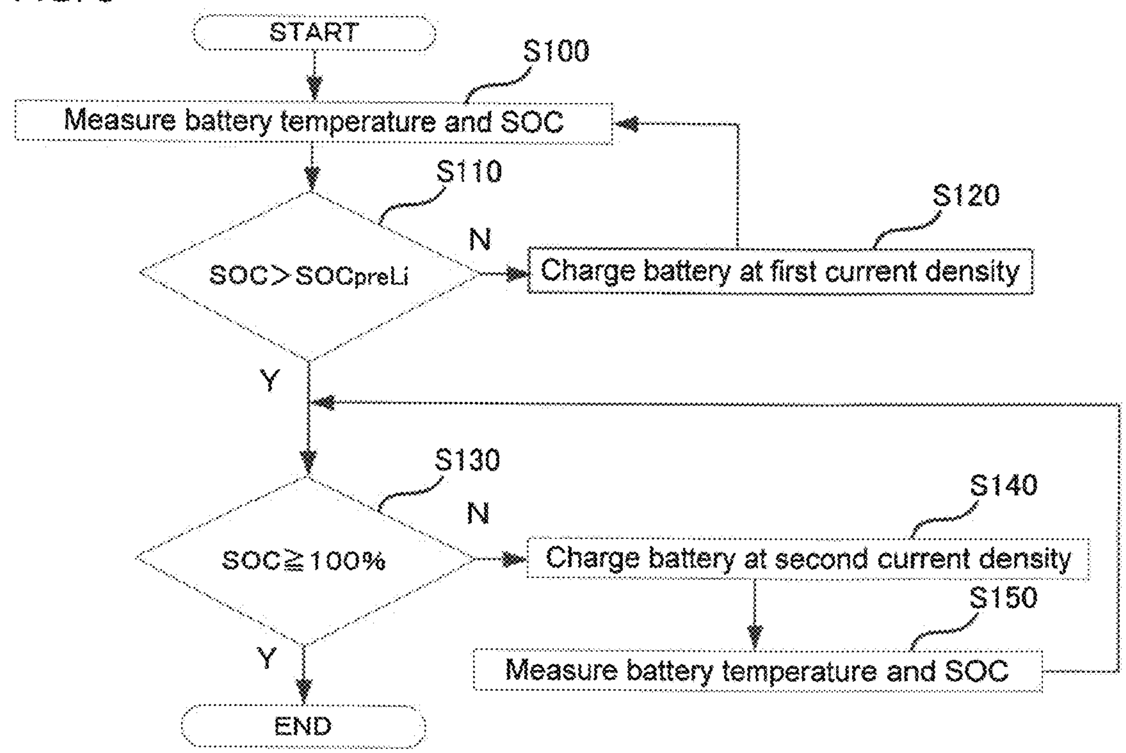
FIG. 5 is a flow chart of an example of the charging method of the disclosed embodiments.

FIG. 5 is a flow chart of an example of the charging method of the disclosed embodiments.

As shown in FIG. 5, the battery may be charged as follows, for example.

First, the temperature and SOC of the battery are measured (S100).

Next, it is determined whether the SOC of the battery is more than the threshold value or not (S110).

Next, if the measured SOC of the battery is the threshold value or less, the first charging is carried out at the first current density I1 (S120).

Next, the temperature and SOC of the battery are measured again (S100).

Next, it is determined again whether the SOC of the battery is more than the threshold value or not (S110).

Next, if the measured SOC of the battery is the threshold value or less, the first charging is continued at the first current density I1 corresponding to the measured temperature (S120).

On the other hand, if the measured SOC of the battery is more than the threshold value, the first charging is stopped, and it is determined whether or not the SOC is 100% or more (S130).

Next, if the SOC of the battery is less than 100%, the second charging is carried out at the second current density corresponding to the measured temperature (S140).

Next, the temperature and SOC of the battery are measured again (S150).

Next, it is determined whether or not the SOC of the battery measured again is 100% or more (S130).

Next, if the measured SOC is less than 100%, the second charging is continued at the second current density corresponding to the measured temperature (S140).

On the other hand, if the measured SOC is 100% or more, the second charging is stopped.

Figure 6:
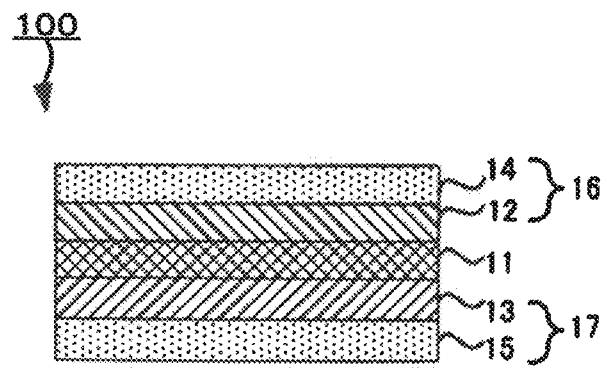
FIG. 6 is a schematic sectional view of an example of the secondary battery used in the disclosed embodiments.

FIG. 6 is a schematic sectional view of an example of the secondary battery used in the disclosed embodiments, the battery being fully charged.

As shown in FIG. 6, a secondary battery 100 comprises a cathode 16, an anode 17, and a solid electrolyte layer 11 disposed between the cathode 16 and the anode 17. The cathode 16 comprises a cathode active material layer 12 and a cathode current collecting foil 14. The anode 17 comprises an anode active material layer 13 and an anode current collecting foil 15. When the anode active material layer 13 is composed of a lithium metal, the anode active material layer 13 may dissolve and disappear in the secondary battery 100 before being initially charged or after being absolutely discharged.

[Cathode]

The cathode comprises at least the cathode active material layer and the cathode current collecting foil.

The cathode active material layer contains a cathode active material. It may contain a solid electrolyte, an electroconductive material and/or a binder as an optional component.

The type of the cathode active material is not particularly limited. The cathode active material can be any type of material that is usable as an active material for secondary batteries. When the secondary battery is an all-solid-state lithium secondary battery, as the cathode active material, examples include, but are not limited to, $LiCoO_2$, $LiNi_xCo_{1-x}O_2$ ($0<x<1$), $LiNi_{1/3}Co_{1/3}Mn_{1/3}O_2$, $LiMnO_2$, different element-substituted Li—Mn spinels (such as $LiMn_{1.5}Ni_{0.5}O_4$, $LiMn_{1.5}Al_{0.5}O_4$, $LiMn_{1.5}Mg_{0.5}O_4$, $LiMn_{1.5}Co_{0.5}O_4$, $LiMn_{1.5}Fe_{0.5}O_4$ and $LiMn_{1.5}Zn_{0.5}O_4$), lithium titanates (such as $Li_4Ti_5O_{12}$), lithium metal phosphates (such as $LiFePO_4$, $LiMnPO_4$, $LiCoPO_4$ and $LiNiPO_4$), transition metal oxides (such as $V_2O_5$ and $MoO_3$), $TiS_2$, LiCoN, Si, $SiO_2$, $Li_2SiO_3$, $Li_4SiO_4$, and lithium storage intermetallic compounds (such as $Mg_2Sn$, $Mg_2Ge$, $Mg_2Sb$ and $Cu_3Sb$).

The form of the cathode active material is not particularly limited. It may be a particulate form.

A coating layer containing a Li ion conducting oxide, may be formed on the surface of the cathode active material. This is because a reaction between the cathode active material and the solid electrolyte can be suppressed.

As the Li ion conducting oxide, examples include, but are not limited to, $LiNbO_3$, $Li_4Ti_5O_{12}$ and $Li_3PO_4$. The thickness of the coating layer is 0.1 nm or more, for example, and it may be 1 nm or more. On the other hand, the thickness of the coating layer is 100 nm or less, for example, and it may be 20 nm or less. Also, for example, 70% or more or 90% or more of the cathode active material surface may be coated with the coating layer.

As the solid electrolyte, examples include, but are not limited to, an oxide-based solid electrolyte and a sulfide-based solid electrolyte.

As the sulfide-based solid electrolyte, examples include, but are not limited to, $Li_2S—P_2S_5$, $Li_2S—SiS_2$, $LiX—Li_2S—SiS_2$, $LiX—Li_2S—P_2S_5$, $LiX—Li_2O—Li_2S—P_2S_5$, $LiX—Li_2S—P_2O_5$, $LiX—Li_3PO_4—P_2S_5$ and $Li_3PS_4$. The "$Li_2S—P_2S_5$" listed above means a material composed of a raw material composition including $Li_2S$ and $P_2S_5$. The same applies to other sulfide-based solid electrolytes listed above. The "X" in the LiX listed above means at least one halogen element selected from the group consisting of F, Cl, Br and I.

The sulfide-based solid electrolyte may be amorphous, a crystalline material or a glass ceramic. A glass can be obtained by subjecting a raw material composition (such as a mixture of $Li_2S$ and $P_2S_5$) to an amorphizing treatment. As the amorphizing treatment, examples include, but are not limited to, mechanical milling. The mechanical milling may be dry or wet mechanical milling. The mechanical milling may be the latter. This is because the raw material composition can be prevented from attaching to the inner wall of a container, etc. The glass ceramic can be obtained by heating the glass. The crystalline material can be obtained by subjecting the raw material composition to a solid-phase reaction treatment, for example.

As the oxide-based solid electrolyte, examples include, but are not limited to, $Li_{6.25}La_3Zr_2Al_{0.25}O_{12}$, $Li_3PO_4$ and $Li_{3+x}PO_{4-x}N_x$ (LiPON).

The form of the solid electrolyte may be a particulate form. The average particle diameter ($D_{50}$) of the solid electrolyte is 0.01 μm or more, for example. On the other hand, the average particle diameter ($D_{50}$) of the solid electrolyte is 10 μm or less, for example. It may be 5 μm or less.

As the solid electrolyte, one or more kinds of solid electrolytes may be used.

The content of the solid electrolyte in the cathode active material layer is not particularly limited.

In the disclosed embodiments, the average particle diameter of particles is a value measured by laser diffraction/scattering particle size distribution analysis. Also in the disclosed embodiments, the median diameter ($D_{50}$) is a diameter at which, when the particle diameters of particles are arranged in ascending order, the accumulated volume of the particles is half (50%) the total volume of the particles.

As the electroconductive material, examples include, but are not limited to, a carbonaceous material and a metal material. As the carbonaceous material, examples include, but are not limited to, carbon black such as acetylene black (AB) and Ketjen Black (KB), and fibrous carbon materials such as vapor-grown carbon fiber (VGCF), carbon nanotube (CNT) and carbon nanofiber (CNF).

The content of the electroconductive material in the cathode active material layer is not particularly limited.

As the binder, examples include, but are not limited to, acrylonitrile-butadiene rubber (ABR), butadiene rubber (BR), polyvinylidene fluoride (PVdF) and styrene-butadiene rubber (SBR). The content of the binder in the cathode active material layer is not particularly limited.

The thickness of the cathode active material layer is not particularly limited.

The method for forming the cathode active material layer is not particularly limited. As the method, examples include, but are not limited to, pressure-forming a powdered cathode mix that contains the cathode active material and, as needed, other components.

[Cathode Current Collecting Foil]

As the cathode current collecting foil, a conventionally-known metal that is usable as a current collector in secondary batteries, can be used. As the metal, examples include, but are not limited to, a metal material containing one or more elements selected from the group consisting of Cu, Ni, Al, V, Au, Pt, Mg, Fe, Ti, Co, Cr, Zn, Ge and In.

[Solid Electrolyte Layer]

The solid electrolyte layer contains at least a solid electrolyte.

As the solid electrolyte contained in the solid electrolyte layer, a conventionally-known solid electrolyte that is usable in all-solid-state batteries, can be appropriately used. As such a solid electrolyte, examples include, but are not limited to, a solid electrolyte that can be incorporated in the above-described cathode.

As the solid electrolyte, one or more kinds of solid electrolytes may be used. In the case of using two or more kinds of solid electrolytes, they may be mixed together, or they may be formed into layers to obtain a multi-layered structure.

The proportion of the solid electrolyte in the solid electrolyte layer is not particularly limited. For example, it may be 50 mass % or more, may be in a range of 60 mass % or more and 100 mass % or less, may be in a range of 70 mass % or more and 100 mass % or less, or may be 100 mass %.

From the viewpoint of exerting plasticity, etc., a binder for binding the solid electrolyte particles can be incorporated in the solid electrolyte layer. As the binder, examples include, but are not limited to, a binder that can be incorporated in the above-described cathode. However, the content of the binder in the solid electrolyte layer may be 5 mass % or less, from the viewpoint of, for example, preventing excessive aggregation of the solid electrolyte and making it possible to form the solid electrolyte layer in which the solid electrolyte is uniformly dispersed, for the purpose of easily achieving high power output.

The thickness of the solid electrolyte layer is not particularly limited. It is generally 0.1 μm or more and 1 mm or less.

As the method for forming the solid electrolyte layer, examples include, but are not limited to, pressure-forming a powdered solid electrolyte material that contains the solid electrolyte and, as needed, other components. In the case of pressure-forming the powdered solid electrolyte material, generally, a press pressure of about 1 MPa or more and about 400 MPa or less is applied.

The pressing method is not particularly limited. As the method, examples include, but are not limited to, applying pressure by use of a plate press machine, a roll press machine, etc.

[Anode]

The anode comprises the anode active material layer and the anode current collecting foil.

The anode active material layer contains an anode active material.

In the disclosed embodiments, during battery charging, the roughness coating layer is formed as at least a part of the anode active material layer. When the anode active material is a lithium metal, the anode active material layer formed after battery charging is all composed of the roughness coating layer composed of the lithium metal. When the anode active material is a lithium alloy, the anode active material layer formed after battery charging, is composed of the roughness coating layer composed of a lithium metal and a metal layer containing at least one of the lithium alloy and a metal that can form an alloy with lithium.

As the anode active material, examples include, but are not limited to, a lithium metal (Li) and a lithium alloy (such as LiSn, LiSi, LiAI, LiGe, LiSb, LiP and LiIn).

As the anode current collecting foil, a conventionally-known metal that is usable as a current collector in secondary batteries, can be used. As the metal, examples include, but are not limited to, a metal material containing one or more elements selected from the group consisting of Cu, Ni, Al, V, Au, Pt, Mg, Fe, Ti, Co, Cr, Zn, Ge and In.

The whole thickness of the anode is not particularly limited.

As needed, the secondary battery comprises an outer casing for housing the cathode, the anode and the solid electrolyte layer.

The form of the outer casing is not particularly limited. As the form, examples include, but are not limited to, a laminate form.

The material for the outer casing is not particularly limited, as long as it is a material that is stable in electrolytes. As the material, examples include, but are not limited to, resins such as polypropylene, polyethylene and acrylic resin.

The secondary battery may be an all-solid-state lithium secondary battery.

As the form of the secondary battery, examples include, but are not limited to, a coin form, a laminate form, a cylindrical form and a square form.

The method for forming the secondary battery is not particularly limited. The secondary battery may be produced by a conventionally-known method.

EXAMPLES

Example 1

[Preparation of all-Solid-State Lithium Secondary Battery]

An all-solid-state lithium secondary battery (hereinafter may be simply referred to as "battery") was prepared, the battery comprising a cathode current collecting foil, a cathode active material layer, a solid electrolyte layer and an anode current collecting foil in this order.

As the solid electrolyte contained in the solid electrolyte layer and the cathode active material layer, a sulfide-based solid electrolyte (a $Li_2S—P_2S_5$-based material containing LiBr and LiI) was used.

The roughness height Y of the anode current collecting foil-side surface of the solid electrolyte layer, was 2.0 μm. The roughness height Y was calculated from a SEM image of the surface of the solid electrolyte layer.

As the cathode active material, $LiNi_{1/3}Co_{1/3}Mn_{1/3}O_2$ was used.

As the cathode current collecting foil and the anode current collecting foil, copper foil was used.

[Charging and Discharging of all-Solid-State Lithium Secondary Battery]

[First Charging]

Then, the battery was left to stand in a thermostat bath at 60° C. for 3 hours to control the temperature of the battery to 60° C.

Next, charging of the battery was started at a constant current of a current density of 2.2 mA/cm$^2$ (corresponding to 0.5 C) as the first current density I1. When the SOC of the battery reached 4.74%, the battery charging was stopped.

The SOC of the battery was estimated as follows. First, the third data group storing the temperature of the battery, the current density of the battery and the characteristic relationship between the open circuit voltage (OCV) and SOC of the battery, was prepared. Then, the battery voltage of the battery, which is the voltage between the terminals of the battery, was measured and determined as the open circuit voltage (OCV). The SOC of the battery was estimated by matching the temperature, current density and open circuit voltage (OCV) of the battery to the third data group.

The first current density I1 was determined as follows. Values which are derived from the relationship between the temperature and SOC of the battery and which allow the formation of the roughness coating layer without the occurrence of battery short circuits, were calculated and determined as the first data group in advance. Then, the first current density I1 was selected from the first data group. Table 1 shows the first data group.

The charging time σ1 of the first charging was 0.08 h. At this time, the thickness X of the roughness coating layer was 1.0 μm, and the X/Y was 0.5. The capacity of the Li metal of the roughness coating layer (Li capacity β (mAh) in the roughness coating layer) was calculated from the SOC of the battery.

The Li capacity β in the roughness coating layer was 0.21 mAh.

TABLE 1

| First current density I1 (mAh/cm²) | | SOC: 0% | SOC: SOC ≤ SOCpreLi |
|---|---|---|---|
| Temperature T | 60° C. | I1 = 2.2 | I1 < 8.7 |
| | 25° C. | I1 > 0.435 | I1 < 6 |
| | 0° C. | I1 = 0.435 | I1 < 4 |
| | −20° C. | I1 = 0.1 | I1 < 2 |

The thickness X of the roughness coating layer was calculated from the following formula (2).

$$\beta = Z \times S \times (X/10000) \times D \qquad \text{Formula (2):}$$

Also, β, Z, S, X and D in the formula (2) are as described below.

β: Li capacity (mAh) in the roughness coating layer

Z: Theoretical capacity (mAh/g) of the lithium metal

S: Area ($cm^2$) of the anode

X: Thickness (μm) of the roughness coating layer

D: Density ($g/cm^3$) of the lithium metal

The Li capacity β (mAh) in the roughness coating layer was calculated from the SOC of the battery.

The theoretical capacity Z of the lithium metal was 3861.1 mAh/g.

The area S ($cm^2$) of the anode was the same as the area of the cathode. Accordingly, the area of the anode was calculated from the area of the cathode. The area S of the anode was 1 $cm^2$.

The density D of the lithium metal was 0.534 $g/cm^3$.

[Second Charging]

Then, charging of the battery was restarted at a constant current of a current density of 8.7 $mA/cm^2$ (corresponding to 2 C) as the second current density I2. When the SOC of the battery reached 100%, the battery charging was stopped.

The second current density I2 was determined as follows. Values which are derived from the relationship between the temperature and SOC of the battery and which allow quick battery charging without the occurrence of battery short circuits, were calculated and determined as the second data group in advance. Then, the second current density I2 was selected from the second data group. Table 2 shows the second data group.

The charging time σ2 of the second charging was 0.48 h. Accordingly, the total charging time t (=σ1+σ2) was 0.56 h.

TABLE 2

| Second current density I2 (mAh/cm²) | | SOC: SOC > SOCpreLi | SOC: 100% |
|---|---|---|---|
| Temperature T | 60° C. | I2 = 8.7 | I2 = 8.7 |
| | 25° C. | I2 = 6 | I2 = 6 |
| | 0° C. | I2 = 4 | I2 = 4 |
| | −20° C. | I2 = 2 | I2 = 2 |

[Discharging]

After 10 minutes elapsed from the second charging, discharging of the battery was started at a constant current of a current density of 0.435 $mA/cm^2$ (corresponding to 0.1 C) and then stopped when the voltage of the battery reached 3.0 V. Then, the reversible capacity (discharge capacity) α (mAh) of the battery was obtained. The reversible capacity α of the battery was 3.69 mAh.

Then, the charging current value (mA) of the battery was calculated from the following formula (3). The charging current value was 7.25 mA. The results are shown in Tables 3 and 4.

$$\text{Charging current value (mA)} = (\alpha - \beta)/\sigma 2 \qquad \text{Formula (3)}$$

Also, α, β and σ2 in the formula (3) are as described below.

α: Reversible capacity (mAh)

β: Li capacity (mAh) in the roughness coating layer

σ2: Charging time (h) of the second charging (h)

As the charging current value increases, the reversible capacity α of the battery with respect to the charging time of the battery increases, and the Li capacity β in the roughness coating layer decreases. Also, as the reversible capacity α of the battery increases, short circuits are less likely to occur in the battery. In addition, as the Li capacity β in the roughness coating layer decreases, the battery charging rate increases. Accordingly, when the charging current value is high, it indicates that short circuits are less likely to occur in the battery, and the battery charging rate is fast.

Example 2

[Preparation of all-Solid-State Lithium Secondary Battery]

An all-solid-state lithium secondary battery was prepared by use of the same materials as Example 1.

[Charging and Discharging of all-Solid-State Lithium Secondary Battery]

[First Charging]

Then, the battery was left to stand in the thermostat bath at 60° C. for 3 hours to control the temperature of the battery to 60° C.

Next, charging of the battery was started at a constant current of a current density of 2.2 $mA/cm^2$ (corresponding to 0.5 C) as the first current density I1. When the SOC of the battery reached 9.48%, the battery charging was stopped. The charging time σ1 of the first charging was 0.20 h. At this time, the thickness X of the roughness coating layer was 2.0 m; the X/Y was 1.0; and the Li capacity β in the roughness coating layer was 0.41 mAh.

[Second Charging]

Then, charging of the battery was restarted at a constant current of a current density of 8.7 $mA/cm^2$ (corresponding to 2 C) as the second current density I2. When the SOC of the battery reached 100%, the battery charging was stopped. The charging time σ2 of the second charging was 0.45 h. Accordingly, the total charging time t was 0.65 h.

[Discharging]

Discharging of the battery was carried out in the same manner as Example 1. The reversible capacity α of the battery was 3.56 mAh. The charging current value was 6.95 mA. The results are shown in Tables 3 and 4.

Example 3

[Preparation of all-Solid-State Lithium Secondary Battery]

An all-solid-state lithium secondary battery was prepared by use of the same materials as Example 1.

[Charging and Discharging of all-Solid-State Lithium Secondary Battery]

[First Charging]

Then, the battery was left to stand in the thermostat bath at 60° C. for 3 hours to control the temperature of the battery to 60° C.

Next, charging of the battery was started at a constant current of a current density of 2.2 $mA/cm^2$ (corresponding to 0.5 C) as the first current density I1. When the SOC of the battery reached 23.7%, the battery charging was stopped. The charging time σ1 of the first charging was 0.48 h. At this time, the thickness X of the roughness coating layer was 5.0 μm; the X/Y was 2.5; and the Li capacity β in the roughness coating layer was 1.03 mAh.

[Second Charging]

Then, charging of the battery was restarted at a constant current of a current density of 8.7 mA/cm$^2$ (corresponding to 2 C) as the second current density I2. When the SOC of the battery reached 100%, the battery charging was stopped. The charging time σ2 of the second charging was 0.38 h. Accordingly, the total charging time t was 0.86 h.

[Discharging]

Discharging of the battery was carried out in the same manner as Example 1. The reversible capacity α of the battery was 3.81 mAh. The charging current value was 7.32 mA. The results are shown in Tables 3 and 4.

Example 4

[Preparation of all-Solid-State Lithium Secondary Battery]

An all-solid-state lithium secondary battery was prepared by use of the same materials as Example 1. [Charging and Discharging of all-Solid-State Lithium Secondary Battery]

[First Charging]

Then, the battery was left to stand in the thermostat bath at 60° C. for 3 hours to control the temperature of the battery to 60° C.

Next, charging of the battery was started at a constant current of a current density of 2.2 mA/cm$^2$ (corresponding to 0.5 C) as the first current density I1. When the SOC of the battery reached 47.4%, the battery charging was stopped. The charging time σ1 of the first charging was 0.96 h. At this time, the thickness X of the roughness coating layer was 10.0 m; the X/Y was 5.0; and the Li capacity β in the roughness coating layer was 2.06 mAh.

[Second Charging]

Then, charging of the battery was restarted at a constant current of a current density of 8.7 mA/cm$^2$ (corresponding to 2 C) as the second current density I2. When the SOC of the battery reached 100%, the battery charging was stopped. The charging time σ2 of the second charging was 0.26 h. Accordingly, the total charging time t was 1.22 h.

[Discharging]

Discharging of the battery was carried out in the same manner as Example 1. The reversible capacity α of the battery was 3.82 mAh. The charging current value was 6.77 mA. The results are shown in Tables 3 and 4.

Comparative Example 1

[Preparation of all-Solid-State Lithium Secondary Battery]

An all-solid-state lithium secondary battery was prepared by use of the same materials as Example 1.

[Charging and Discharging of all-Solid-State Lithium Secondary Battery]

[First Charging]

Then, the battery was left to stand in the thermostat bath at 60° C. for 3 hours to control the temperature of the battery to 60° C.

Next, charging of the battery was started at a constant current of a current density of 0.435 mA/cm$^2$ (corresponding to 0.1 C) as the first current density I1. When the SOC of the battery reached 100%, the battery charging was stopped. The charging time σ1 of the first charging was 10 h. At this time, the thickness X of the roughness coating layer was 21.0 μm; the X/Y was 10.5; and the Li capacity β in the roughness coating layer was 4.35 mAh.

[Second Charging]

In Comparative Example 1, the second charging was not carried out. Accordingly, the total charging time t was 10 h.

[Discharging]

Discharging of the battery was carried out in the same manner as Example 1. The reversible capacity α of the battery was 4.07 mAh. The charging current value was 0.41 mA. Since the second charging was not carried out, the charging current value was calculated by use of the charging time σ1 of the above-described [First charging]. The results are shown in Tables 3 and 4.

Comparative Example 2

[Preparation of all-Solid-State Lithium Secondary Battery]

An all-solid-state lithium secondary battery was prepared by use of the same materials as Example 1.

[Charging and Discharging of all-Solid-State Lithium Secondary Battery]

[First Charging]

In Comparative Example 2, the first charging was not carried out.

[Second Charging]

Then, the battery was left to stand in the thermostat bath at 60° C. for 3 hours to control the temperature of the battery to 60° C.

Next, charging of the battery was started at a constant current of a current density of 8.7 mA/cm$^2$ (corresponding to 2 C) as the second current density I2. When the SOC of the battery reached 100%, the battery charging was stopped. The charging time σ2 of the second charging was 0.50 h. Accordingly, the total charging time t was 0.50 h. Since the first charging was not carried out in Comparative Example 2, the thickness X of the roughness coating layer in the first charging was 0 μm; the X/Y in the first charging was 0; and the Li capacity β in the roughness coating layer in the first charging was 0 mAh.

[Discharging]

Discharging of the battery was carried out in the same manner as Example 1. The reversible capacity α of the battery was 2.83 mAh. The charging current value was 5.65 mA. The results are shown in Tables 3 and 4.

Comparative Example 3

[Preparation of all-Solid-State Lithium Secondary Battery]

An all-solid-state lithium secondary battery was prepared by use of the same materials as Example 1.

[Charging and Discharging of all-Solid-State Lithium Secondary Battery]

[First Charging]

Then, the battery was left to stand in the thermostat bath at 60° C. for 3 hours to control the temperature of the battery to 60° C.

Next, charging of the battery was started at a constant current of a current density of 2.2 mA/cm$^2$ (corresponding to 0.5 C) as the first current density I1. When the SOC of the battery reached 2.37%, the battery charging was stopped. The charging time σ1 of the first charging was 0.04 h. At this time, the thickness X of the roughness coating layer was 0.5 μm; the X/Y was 0.25; and the Li capacity β in the roughness coating layer was 0.10 mAh.

[Second Charging]

Then, charging of the battery was restarted at a constant current of a current density of 8.7 mA/cm$^2$ (corresponding to 2 C) as the second current density I2. When the SOC of the battery reached 100%, the battery charging was stopped. The charging time σ2 of the second charging was 0.49 h. Accordingly, the total charging time t was 0.53 h.

[Discharging]

Discharging of the battery was carried out in the same manner as Example 1. The reversible capacity α of the battery was 2.91 mAh. The charging current value was 5.74 mA. The results are shown in Tables 3 and 4.

TABLE 3

| | First current density I1 (mA/cm$^2$) | Charging time σ1 (h) of first charging | Li capacity β (mAh) in roughness coating layer | SOC (%) after first charging | Roughness height Y (μm) of surface of solid electrolyte layer | Thickness X (μm) of roughness coating layer | X/Y |
|---|---|---|---|---|---|---|---|
| Comparative Example 1 | 0.435 | 10 | 4.35 | 100 | 2.0 | 21.0 | 10.5 |
| Comparative Example 2 | 0 | 0 | 0 | 0 | 2.0 | 0 | 0 |
| Comparative Example 3 | 2.2 | 0.04 | 0.10 | 2.37 | 2.0 | 0.5 | 0.25 |
| Example 1 | 2.2 | 0.08 | 0.21 | 4.74 | 2.0 | 1.0 | 0.5 |
| Example 2 | 2.2 | 0.20 | 0.41 | 9.48 | 2.0 | 2.0 | 1.0 |
| Example 3 | 2.2 | 0.48 | 1.03 | 23.7 | 2.0 | 5.0 | 2.5 |
| Example 4 | 2.2 | 0.96 | 2.06 | 47.4 | 2.0 | 10 | 5.0 |

TABLE 4

| | Second current density I2 (mA/cm$^2$) | Charging time σ2 (h) of second charging | Total charging time t (h) (=σ1 + σ2) | Reversible capacity α (mAh) | Charging current value (α − β)/σ2 (mA) |
|---|---|---|---|---|---|
| Comparative Example 1 | 0 | 0 | 10 | 4.07 | 0.41 (σ1 ≈ σ2) |
| Comparative Example 2 | 8.7 | 0.50 | 0.50 | 2.83 | 5.65 |
| Comparative Example 3 | 8.7 | 0.49 | 0.53 | 2.91 | 5.74 |
| Example 1 | 8.7 | 0.48 | 0.56 | 3.69 | 7.25 |
| Example 2 | 8.7 | 0.45 | 0.65 | 3.56 | 6.95 |
| Example 3 | 8.7 | 0.38 | 0.86 | 3.81 | 7.32 |
| Example 4 | 8.7 | 0.26 | 1.22 | 3.82 | 6.77 |

[Evaluation Results]

Figure 7:
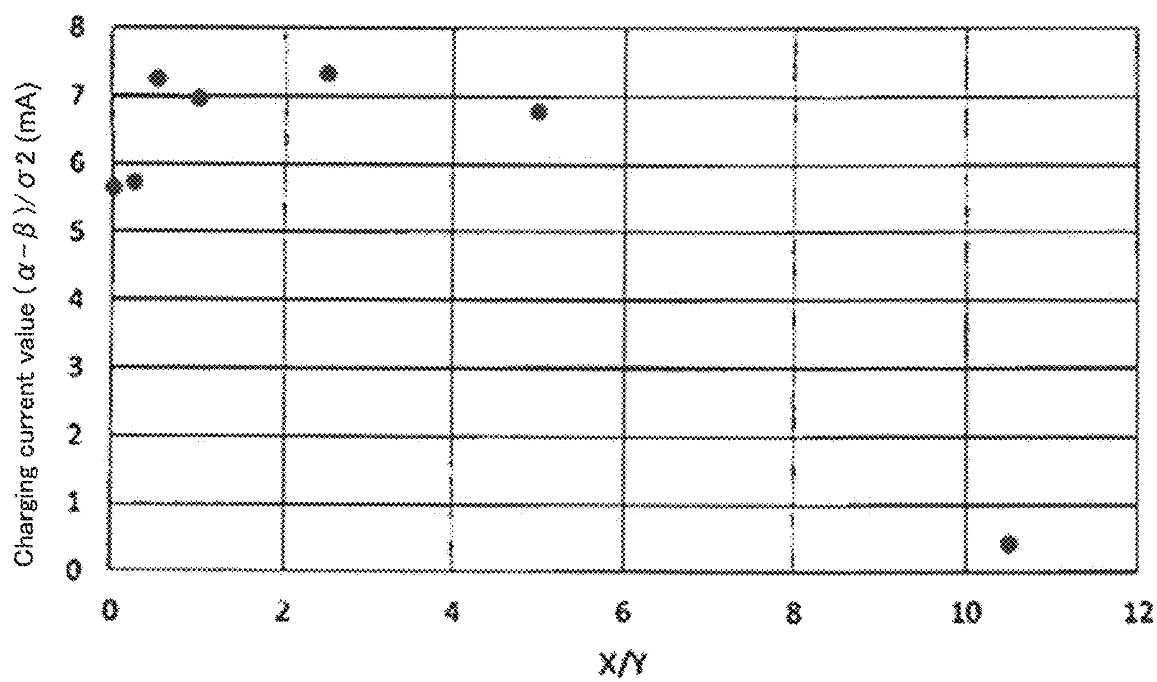
FIG. 7 is a view showing a relationship between X/Y and charging current value.

FIG. 7 is a view showing a relationship between X/Y and charging current value (α−β)/σ2.

It was revealed that if the X/Y is from 0.5 to 5.0, the charging current value is high compared to the case where the X/Y is 0 or more and less than 0.5 and the case where the X/Y is more than 5.0. Accordingly, it was confirmed that if the X/Y is from 0.5 to 5.0, both an increase in reversible capacity and a reduction in battery charging time, are achieved.

In the case of Comparative Example 1 in which the battery charging was carried out at the low current density from beginning to end, due to the low current density during the battery charging, the lithium metal can be uniformly precipitated on the surface of the solid electrolyte layer. Accordingly, the reversible capacity of the battery is high. However, the battery charging time is increased, and the charging current value is decreased.

In the case of Comparative Example 2 in which the battery charging was carried out at the high current density from beginning to end and Comparative Example 3 in which the X/Y was less than 0.5, it is thought that due to non-uniform interface contact between the solid electrolyte layer and the anode current collecting foil, the lithium metal was locally deposited and non-uniformly grown, and the grown lithium metal reached the cathode, thereby causing a battery short circuit and resulting in a decrease in reversible capacity.

Accordingly, in the disclosed embodiments, the lithium metal precipitation starting points are highly dispersed by coating the roughness of the anode current collecting foil-side surface of the solid electrolyte layer with the roughness coating layer composed of the lithium metal. Accordingly, even if the battery is then quickly charged at a high current density, the lithium metal is uniformly precipitated on the surface of the solid electrolyte layer and uniformly grown. It is thought that as a result, battery short circuits are suppressed.

REFERENCE SIGNS LIST

11. Solid electrolyte layer
12. Cathode active material layer
13. Anode active material layer
14. Cathode current collecting foil
15. Anode current collecting foil
16. Cathode
17. Anode
18. Roughness coating layer
21. Contact point
22. Lithium metal
100. Secondary battery

The invention claimed is:

1. A method for charging a secondary battery comprising a cathode current collecting foil, a cathode active material layer, a solid electrolyte layer and an anode current collecting foil in this order and using at least one of a lithium metal and a lithium alloy as an anode active material and using a lithium metal precipitation-dissolution reaction as an anode reaction, wherein the charging method is a multistep secondary battery charging method comprising at least:

first charging in which, by charging the secondary battery at a first current density I1 ($mA/cm^2$), a lithium metal is precipitated on an anode current collecting foil-side surface of the solid electrolyte layer to form a roughness coating layer which is a part of an anode active material layer and which is composed of the lithium metal, and second charging in which, after the first charging, the secondary battery is charged at a second current density I2 which is larger than the first current density I1 to increase a thickness of the roughness coating layer, wherein, when a roughness height of the anode current collecting foil-side surface of the solid electrolyte layer is determined as Y (μm) and a thickness of the roughness coating layer is determined as X (μm), in the first charging, the secondary battery is charged at the first current density I1 until X/Y reaches 0.5 or more wherein the method further comprises calculating a state-of-charge (SOC) value of the secondary battery based on a temperature T, current density I and voltage V of the secondary battery after measuring the temperature T, the current density I and the voltage V;

wherein, if the SOC is a predetermined threshold value (SOC (pre-Li)) or less, the first charging is carried out;

wherein, if the SOC is more than the threshold value, the second charging is carried out; and wherein the threshold value satisfies the following formula (1):

$$\text{SOC(pre-Li)}(\%)=[\{S\times(Y/10000)\times D\times Z/2\}/M]\times 100 \quad \text{(Formula (1))}$$

where S is an area ($cm^2$) of the anode; Y is the roughness height (μm) of the solid electrolyte layer; D is a density ($g/cm^3$) of the lithium metal; Z is a theoretical capacity (mAh/g) of the lithium metal; and M is a capacity (mAh) of the secondary battery.

2. The charging method according to claim 1, wherein the first current density I1 is determined from the temperature T and the SOC, based on a first data group showing a relationship between the current density I and the previously calculated temperature T and SOC.

3. The charging method according to claim 2, wherein, in the first charging, measurement of the temperature T and calculation of the SOC are carried out every time a predetermined time elapses; if the SOC is the threshold value or less, based on the first data group, the current density I corresponding to the temperature T and the SOC is used as the first current density I1, and the secondary battery is charged at the first current density I1; and if the SOC is more than the threshold value, the first charging is stopped, and the second charging is carried out.

4. The charging method according to claim 1, wherein the second current density I2 is determined from the temperature T and the threshold value, based on a second data group showing a relationship between the current density I and the previously calculated temperature T and threshold value.

5. The charging method according to claim 4, wherein, in the second charging, measurement of the temperature T and calculation of the SOC are carried out every time a predetermined time elapses; if the SOC is less than 100%, based on the second data group, the current density I corresponding to the temperature T and the SOC is used as the second current density I2, and the secondary battery is charged at the second current density I2; and if the SOC is 100% or more, the second charging is stopped.

6. A method for charging a secondary battery comprising a cathode current collecting foil, a cathode active material layer, a solid electrolyte layer and an anode current collecting foil in this order and using a lithium metal precipitation-dissolution reaction as an anode reaction, wherein the method comprises calculating a state-of-charge (SOC) value of the secondary battery based on a temperature T, current density I and voltage V of the secondary battery after measuring the temperature T, the current density I and the voltage V;

wherein, if the SOC is a predetermined threshold value (SOC (pre-Li)) or less, first charging in which, by charging the secondary battery at a first current density I1 ($mA/cm^2$), a lithium metal is precipitated on an anode current collecting foil-side surface of the solid electrolyte layer to form a roughness coating layer which is a part of an anode active material layer and which is composed of the lithium metal, is carried out;

wherein, if the SOC is more than the threshold value, second charging in which the secondary battery is charged at a second current density I2 which is larger than the first current density Il to increase a thickness of the roughness coating layer, is carried out; and wherein the threshold value satisfies the following formula (1):

$$\text{Soc(pre-Li)}(\%)=[\{S\times(Y/10000)\times D\times Z/2\}/M]\times 100 \quad \text{Formula (1)}$$

where S is an area ($cm^2$) of the anode; Y is a roughness height (μm) of the anode current collecting foil-side surface of the solid electrolyte layer; D is a density ($g/cm^3$) of the lithium metal; Z is a theoretical capacity (mAh/g) of the lithium metal; and M is a capacity (mAh) of the secondary battery.

* * * * *